United States Patent
Schulz et al.

(10) Patent No.: US 7,652,487 B2
(45) Date of Patent: Jan. 26, 2010

(54) CIRCUIT ARRANGEMENT FOR DETECTING THE CAPACITANCE OR CHANGE OF CAPACITANCE OF A CAPACITIVE CIRCUIT ELEMENT OR OF A COMPONENT

(75) Inventors: Joerg Schulz, Tettnang (DE); Markus von Ehr, Langenargen (DE); Werner Hoch, Tettnang (DE)

(73) Assignee: i f m electronic GmbH, Essen (DE)

( * ) Notice: Subject to any disclaimer, the term of this patent is extended or adjusted under 35 U.S.C. 154(b) by 252 days.

(21) Appl. No.: 11/766,479

(22) Filed: Jun. 21, 2007

(65) Prior Publication Data
US 2008/0012581 A1 Jan. 17, 2008

(30) Foreign Application Priority Data
Jun. 22, 2006 (DE) ........................ 10 2006 029 120

(51) Int. Cl.
*G01R 27/26* (2006.01)
(52) U.S. Cl. .................. 324/676; 324/677; 324/686
(58) Field of Classification Search ................ 324/662, 324/676, 677, 686
See application file for complete search history.

(56) References Cited

U.S. PATENT DOCUMENTS

| | | | | |
|---|---|---|---|---|
| 3,732,506 A | * | 5/1973 | Dupuy | 332/108 |
| 4,642,555 A | * | 2/1987 | Swartz et al. | 324/677 |
| 6,194,903 B1 | * | 2/2001 | Schulz | 324/678 |
| 6,225,710 B1 | | 5/2001 | Palata et al. | |

FOREIGN PATENT DOCUMENTS

DE     102 58 417 B3     8/2004

* cited by examiner

*Primary Examiner*—Timothy J Dole
(74) *Attorney, Agent, or Firm*—David S. Safran; Roberts Mlotkowski Safran & Cole, P.C.

(57) ABSTRACT

A circuit arrangement is described for detecting the capacitance or change of capacitance of a capacitive circuit element or of a component, specifically of a sensor capacitor (1), with a control unit (2) ,with a monostable multivibrator (3) triggered by the control unit (2), and with an evaluation unit (4), the monostable multivibrator (3) having a first input (5) which is connected to the control unit (2), a second input (6)which is connected to the sensor capacitor (1), and one output (7), of the monostable multivibrator (3) is triggered by the control unit (2) at the output (7) of the monostable multivibrator (3) an output signal or output signals appearing, with a time duration which is proportional to the capacitance of the sensor capacitor (1), the output signal or output signals of the monostable multivibrator (3)being converted into a signal voltage proportional to its or their duration, and in the evaluation unit (4) a detection value corresponding to the capacitance or change of capacitance of the sensor capacitor (1) being obtained from the signal voltage, The circuit arrangement as claimed in the invention is improved compared to the prior art in the output (7) of the monostable multivibrator (3) is connected upstream of a constant current generator (8) which can be controlled by its output signal or output signals and that an integrator (9) which converts the current delivered from the constant current generator (8)into the signal voltage is connected to the constant current generator (8).

20 Claims, 2 Drawing Sheets

CIRCUIT ARRANGEMENT FOR DETECTING THE CAPACITANCE OR CHANGE OF CAPACITANCE OF A CAPACITIVE CIRCUIT ELEMENT OR OF A COMPONENT

BACKGROUND OF THE INVENTION

1. Field of the Invention

The invention relates to a circuit arrangement for detecting the capacitance or change of capacitance of a capacitive circuit element or of a component, with a control unit, with a monostable multivibrator triggered by the control unit, and with an evaluation unit, the monostable multivibrator having a first input connected to the control unit, a second input connected to the capacitive circuit element or component, and when the monostable multivibrator is triggered by the control unit at the output of the monostable multivibrator, an output signal or output signals appears with a time duration which is proportional to the capacitance of a capacitive circuit element or component, the output signal or output signals of the monostable multivibrator being converted into a signal voltage proportional to its or their duration, and in the evaluation unit, a detection value corresponding to the capacitance or change of capacitance of the capacitive circuit element or component being obtained from the signal voltage.

2. Description of Related Art

Within the framework of the invention "capacitance" means the capacitance value of a capacitive circuit element or component; "change of capacitance" consequently means a change of the capacitance value of a capacitive circuit element or component, "detection" of the capacitance or change of the capacitance within the framework of the invention means both only qualitative detection and also quantitative detection, therefore a genuine measurement. A "capacitive circuit element or component" within the framework of the invention means any circuit element and any component which has capacitive properties, often also called capacitance, then the capacitance value not being intended. A "capacitive circuit element or component" is especially a capacitor.

However, a "capacitive circuit element or component" within the framework of the invention also means the electrode of a capacitive proximity switch, in interaction with an influencing body. A "capacitive circuit element or component" within the framework of the invention also means, for example, the capacitance which is constituted by lines which capacitively interact with one another. Instead of a "capacitive circuit element or component," a sensor capacitor is also addressed without thus being linked to a limitation to a capacitor in the narrower sense.

Multivibrators are positive feedback digital circuits (see, Tietze/Schenk *Semiconductor Circuit Engineering*, 12th edition, page 600). They differ from the positive feedback linear circuits (oscillators) in that their output voltage does not change continuously, but jumps back and forth only between two fixed values. The flipping process can be triggered in different ways. A monostable multivibrator which belongs to the circuit arrangement of the type to which the invention is directed has only one stable state. The second state is stable only for a certain time interval which is fixed by dimensioning. After this time interval expires, the circuit flips back into the stable state by itself. Therefore, it is also called a time switch, monoflop, univibrator or oneshot. Monostable multivibrators can be implemented quite differently (see, for example, Tietze/Schenk, op. cit, pages 603 and 604, 608 and 609 and 618 to 620). For their implementation, especially logic components can be combined with one another, for example, XOR, coincidence gate, AND, NARD, NOR, OR or/and a flip-flop.

In the known circuit arrangement underlying the invention (see, DE 102 58 417 B3), the control unit, a clock generator, produces a low-frequency clock sequence, for example, with a clock frequency of 1 kHz, and a lowpass filter is connected downstream to the output of the monostable multivibrator and the signal voltage can be tapped at the filter output.

SUMMARY OF THE INVENTION

Proceeding from the initially described circuit arrangement which was explained above, the object of the invention is to devise a conversely improved circuit arrangement.

The circuit arrangement in accordance with the invention is, first of all, characterized essentially in that the output of the monostable multivibrator is connected upstream of a constant current generator which can be controlled by its output signal or output signals and that an integrator which converts the current delivered by the constant current generator into the signal voltage is connected to the constant current generator.

It applies to the circuit arrangement in accordance with the invention, as to the circuit arrangement underlying the invention, that an output signal appears or output signals appear at the output of the monostable multivibrator, with a time duration which is proportional to the capacitance of a capacitive circuit element or component. Consequently, the constant current generator connected downstream of the output of the monostable multivibrator in accordance with the invention is controlled depending on the time duration of the output signal or output signals. In the simplest case, the constant current generator can be turned on by the output signal or output signals of the monostable multivibrator for its or their duration. During the time interval in which the constant current generator is turned on by the output signal or output signals of the monostable multivibrator, the constant current generator delivers current to the integrator, by which a signal voltage which is proportional to the time duration of the output signal or output signals of the monostable multivibrator is formed. Since the time duration of the output signal or output signals of the monostable multivibrator is proportional to the capacitance of the capacitive circuit element or component, the signal voltage which can be tapped on the integrator is proportional to the capacitance or change in the capacitance which is to be detected.

In the past, it has always been expressed that, when the monostable multivibrator is triggered by the control unit, an output signal or output signals is/are formed at the output of the monostable multivibrator. Since it is an output signal or output signals at the output of the monostable multivibrator, the question whether one output signal or output signals form depends, naturally, on how the monostable multivibrator is triggered by the control unit; one trigger signal leads to one output signal, several trigger signals lead to several output signals. In accordance with the invention, both an output signal and consequently a trigger signal of the control unit, and also several output signals and consequently several trigger signals of the control unit can be used. The control unit should also of course be designed accordingly.

If an output signal or several output signals and a trigger signal or several trigger signals are addressed above and below, this is always relative to the detection time interval. If the detection of the capacitance or change of capacitance of a capacitive circuit element or component is to proceed continuously, each detection time interval is followed by a new detection time interval, in the next detection time interval a new trigger signal and a new output signal generated by it follow each trigger signal and each output signal generated by it; the corresponding applies when in the detection time interval several trigger signals and several output signals generated by them are used.

An essential function of the control unit is generation of at least one trigger signal for triggering the monostable multivibrator. Preferably, the control unit is made such that it provides a rectangular trigger signal or rectangular trigger signals. For this purpose, the control unit can have an oscillator, and then, a rectangular trigger signal or rectangular trigger signals can be extracted from the oscillator voltage in a well known manner.

In the circuit arrangement in accordance with the invention, the monostable multivibrator can be made such that only the rising edge or only the falling edge of the rectangular trigger signal or rectangular trigger signals of the control unit trigger the flipping process in the monostable multivibrator. In particular, when only one trigger signal of the control unit and consequently one output signal of the monostable multivibrator are used, only the rising edge or only the falling edge of the rectangular trigger signal can be used because, specifically in fact, only one output signal forms at the output of the monostable multivibrator. However, especially when several trigger signals of the control unit and consequently several output signals at the output of the monostable multivibrator are used, can it be recommended that the monostable multivibrator be made such that both the rising edge and also the falling edge of the rectangular trigger signals of the control unit for the monostable multivibrator trigger the flipping process. If both the rising edge and also the falling edge of the trigger signal of the control unit trigger the tilting process for the monostable multivibrator, for a certain number of trigger signals of the control unit, twice the number of output signals of the monostable multivibrator is easily obtained. Therefore, if a clock frequency $f_T$ is to be used for the monostable multivibrator, a trigger signal frequency $f_A$ of the control unit of $f_T/2$ is sufficient.

It was stated above that, preferably, the control unit has an oscillator and the trigger signal or trigger signals are extracted from the oscillator voltage. Easily, i.e., without additional measures, there is then a sequence of trigger signals, the trigger signal frequency $f_A$ corresponds to the oscillator frequency $f_o$. If this is not desired, provision can be made in the control unit for trigger signals to be formed with a time sequence which does not correspond to the time sequence of the oscillator voltage. However, provision can also be made for only each n-th—n being uniform or variable—trigger signal of the control unit in the monostable multivibrator to trigger the flipping process in the monostable multivibrator.

Otherwise, it can also be feasible for the control unit to provide as the trigger signal a binary random signal or a pseudorandom noise signal. In this way, a relatively low EMC emission can be achieved. On the problems of EMC emission, reference is made otherwise in addition to the disclosure contents of German Patent 198 13 013 which corresponds to U.S. Pat. No. 6,225,710 B1.

It was stated above that an essential function of the control unit is to generate at least one trigger signal for triggering the monostable multivibrator. This indicates that the control unit can also be used more extensively.

With reference to the control unit which belongs to the circuit arrangement in accordance with the invention, another teaching of the invention is characterized in that the control unit—in addition to the trigger signal or the trigger signals—provides a constant current generator influencing signal, and with the constant current generator influencing signal, the current intensity of the constant current generator can be influenced, especially can be controlled or adjusted. The influencing of the current intensity of the constant current generator can take place, first of all, outside the detection time interval; then therefore, using the constant current generator influencing signal, the current intensity of the constant current generator which is to be active during the detection time interval can be set. It is also possible to influence, therefore set, the current intensity of the constant current generator during the detection time interval, but outside of the time interval in which an output signal appears at the output of the monostable multivibrator. Finally, however, it is also possible to allow the constant current generator influencing signal to influence the current intensity of the constant current generator during its operation, therefore during the time in which the constant current generator is triggered by the output signal of the monostable multivibrator; in this version therefore the constant current generator delivers only a more or less constant current.

It is explained farther below what sense it can make to allow the control unit to provide a constant current generator influencing signal, and thus, to influence the constant current generator, especially to control or adjust it with respect to the current intensity.

As stated above, the monostable multivibrator belonging to the circuit arrangement in accordance with the invention can be made quite differently. According to another teaching of the invention, it is preferably made with relatively low resistance on its second input which is connected to the capacitive circuit element or component. "With relatively low resistance" should be reflected on the relatively high-resistance portion of the impedance of the capacitive circuit element or component, with a capacitance or change of capacitance which is to be detected. The above described version of the monostable multivibrator leads to the resistive portions of the capacitive circuit element or component influencing the result of detection only little. This is, for example, important in circuit arrangements for sensor capacitors with a response electrode or a reference electrode when the response electrode is the door handle of a motor vehicle, and moisture, especially rain, can be important as the resistive portion.

As stated, the circuit arrangement in accordance with the invention includes an integrator which is connected to the constant current generator and which converts the current which has been delivered by the constant current generator into a signal voltage. The integrator is preferably a capacitor. Therefore, this is a good idea because, as is recognized, the voltage on the capacitor corresponds to the integral of the current flowing in the capacitor over time, at a constant current flowing into the capacitor, so that the voltage rises linearly with time.

An essential function of the evaluation unit is the generation of a response value, called the detection value here and below, for an only qualitative detection or measured value in the quantitative detection of the capacitance or change of capacitance of a capacitive circuit element or component. Assuming that this function is guaranteed, the evaluation unit can be made quite differently, almost as desired. One preferred embodiment of the circuit arrangement in accordance with the invention is, however, characterized in that the evaluation unit has a comparator which compares the signal voltage to a threshold value and when the signal voltage has reached the threshold value, a detection signal is triggered. In this connection, but also independently thereof, it is recommended that the evaluation unit on the input side be provided with an analog/digital converter and with the analog/digital converter be connected to the output of the integrator.

Within the evaluation unit, the detection of the capacitance or change of capacitance can take place in different ways. One possibility consists in determining the capacitance or change of capacitance to be detected from the detection time; the detection time is the time interval from the start of a detection time interval until triggering of the detection signal. Another possibility consists in determining the capacitance or change of capacitance to be detected from the detection number of trigger signals; the detection number is the number of trigger signals from the start of the detection time interval to triggering of the detection signal.

An essential function of the control unit is generation of at least one trigger signal for the monostable multivibrator. However, the control unit can also be designed for other functions. This was explained above once for the first preferred embodiment of the circuit arrangement in accordance with the invention in which specifically the control unit—in addition to the trigger signal or trigger signals—provides a constant current generator influencing signal.

In a second preferred embodiment of the circuit arrangement in accordance with the invention, with reference to the configuration of the control unit, the control unit—in addition to the trigger signal or trigger signals—provides a connection signal, with which a second constant current generator can be connected, which in the connected state acts in the same direction or opposite direction to the first constant current generator on the integrator.

In a third preferred embodiment of the circuit arrangement in accordance with the invention, with reference to the configuration of the control unit, the control unit—in addition to the trigger signal or trigger signals—provides another connection signal, there is a second constant current generator or a discharge resistor, the second constant current generator can be connected in the opposite direction to the first constant current generator or the discharge resistor with the second connection signal, and the capacitance or change of capacitance to be detected is determined from the discharge time; the discharge time is the time interval from the start of discharge by the second constant current generator or by the discharge resistor until it drops below a threshold value.

In a fourth preferred embodiment of the circuit arrangement in accordance with the invention, with reference to the configuration of the control unit, the control unit—in addition to the trigger signal or trigger signals and optionally in addition to one and/or the other above explained connection signal—provides a third connection signal with which a second integrator can be connected which in the connected state acts in the same direction or in the opposite direction to the first integrator. In this connection, the second integrator can, in turn, be a capacitor. The capacitance value of the second capacitor can correspond roughly to the capacitance value of the first capacitor, the capacitance value of the second capacitor can however also be small compared to the capacitance value of the first capacitor.

It was stated above that the control unit—in addition to the trigger signal or trigger signals—can provide a constant current generator influencing signal with which a constant current generator can be influenced with respect to the current intensity of the current delivered by it, especially can be controlled or adjusted. This additional teaching of the invention and the aforementioned additional teachings of the invention, specifically allowing the control unit to provide a first connection signal, and optionally, a second connection signal, and providing a second constant current generator, and optionally, a second integrator, are of special importance for the preferred embodiment of the circuit arrangement in accordance with the invention, in which the evaluation unit has an analog/digital converter. In analog/digital converters what is important is the resolution. This resolution can be increased by the above addressed measures. Each of these measures by itself, several of these measures together and mainly all the illustrated measures together can be used such that maximum resolution is achieved that the analog/digital converter used at the time can achieve—by the number of bits—is also used.

The circuit arrangement in accordance with the invention, as compared to the prior circuit arrangement underlying the invention, has major advantages which are partially achieved by the fundamental teaching of the invention, partially in the preferred embodiments. Thus, the circuit arrangement in accordance with the invention allows, first of all, especially rapid detection of the capacitance or change of capacitance of a capacitive circuit element or component; detection times of less than 100 µs can be achieved, relatively low EMC emission can also be achieved—an advantage which has recently acquired increasing importance and will continue to do so. The circuit arrangement in accordance with the invention is not only advantageous with reference to problems of EMC emission in an active respect, i.e., with respect to reducing or avoiding noise emission of the circuit arrangement in accordance with the invention, it is also advantageous with respect to problems of EMC emission in a passive regard, i.e. with respect to incident noise irradiation. It is of major importance that the circuit arrangement in accordance with the invention can be implemented in an especially simple manner so that resistive portions of the capacitive circuit element or component do not influence the result of detection or do so very little.

In accordance with the invention, it is a circuit arrangement for detecting the capacitance or change of capacitance of a capacitive circuit element or component. What was explained above makes the teaching of the invention in the detection of the capacitance of a capacitive circuit element or component easily understandable. However, it also becomes easily understandable if, for detection of the change of capacitance of a capacitive circuit element or component, it is imagined that the capacitance value of the corresponding capacitive circuit element or component is first stored as a reference value. Then, a change of capacitance, reflected on the stored reference value, can be easily detected.

In preferred embodiments of the circuit arrangement in accordance with the invention, as stated, the current intensity of the constant current generator is influenced, especially controlled or adjusted, there is a second constant current generator and/or a second integrator. The effects of these measures which at first glance make the detection of the capacitance or change of capacitance of a capacitive circuit element or component seem complicated, however, can be managed with modem technology, for example, when these effects are considered in the evaluation unit, especially by microprocessors.

In the prior art, measurement and control devices are known in which a window function is accomplished. It can also be advantageous to implement the circuit arrangement in accordance with the invention with a window function, therefore to provide for the trigger signals of the control unit and/or the output signals of the monostable multivibrator to be active only during a preferably adjustable time window. This can be performed in quite different ways, for example, by a trigger signal being used as the start signal and a second trigger signal being used as the window signal and the output signal of the monostable multivibrator which has been generated by the first trigger signal and the window signal being delivered to a gate circuit.

The circuit arrangement in accordance with the invention can also be used especially advantageously when the capacitance or change of capacitance of several capacitive circuit elements or components is to be detected. Then, specifically, only one control unit, only one monostable multivibrator, only one constant current generator, only one integrator and/or only one evaluation unit can be used when the principle of time division multiplex operation is used for the individual components.

To refine the measurement, oversampling can be performed by repeated measurement after integration, for which the signal voltage is slowly changed, for example, by discharge of the integrator.

Furthermore, it is pointed out that the circuit arrangement in accordance with the invention can, likewise, also be operated inversely. Inverse operation, here, means that all charging processes, i.e., integration of the current delivered by the constant current generator, can also be operated as discharge processes.

Finally, another teaching of the invention relates to a circuit arrangement for detecting the capacitances or changes of capacitance of two or more capacitive circuit elements and/or components; only two circuit elements or components are always assumed below. This circuit arrangement according to another teaching of the invention which acquires special importance is characterized in that there is a second monostable multivibrator triggered by the control unit, the second monostable multivibrator has a second input connected to the second capacitive circuit element or component, upon triggering of the second monostable multivibrator by the control unit at the output of the second monostable multivibrator one output signal or output signals form, with a time duration which is proportional to the capacitance of the second capacitive circuit element or component, that the output of the first monostable multivibrator and the output of the second monostable multivibrator are connected to a logic module and that the constant current generator is connected to the output of the logic module. In this circuit arrangement in accordance with the invention, therefore, the simple sum, the simple difference or other combination of the capacitance or change of capacitance of two or more capacitive circuit elements or/and components can be detected. In particular, there are various possibilities for embodying and developing the circuit arrangement in accordance with the invention. For this purpose, reference is made to the following explanation in conjunction with the drawings.

DETAILED DESCRIPTION OF THE INVENTION

Figure 1:
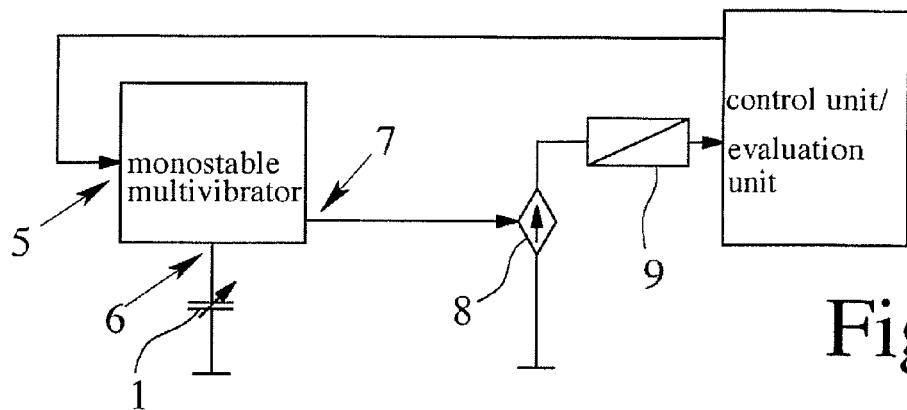
FIGS. 1 to 5 each show different embodiments of the circuit arrangement in accordance with the invention in the form of block diagrams.
Figure 2:
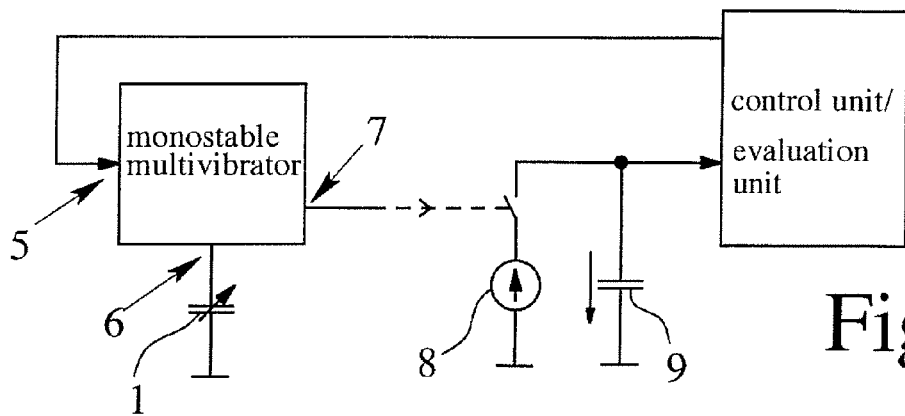

The circuit arrangements in accordance with the invention are used to detect the capacitance or change of capacitance of a capacitive circuit element or component. In the illustrated embodiments, it is qualitative or quantitative detection of the capacitance of the sensor capacitor 1. The sensor capacitor 1 shown in the figures as a normal variable capacitor can be comprised of a response electrode and a reference electrode, and the reference electrode can be ground. The response electrode can be, for example, the door handle of a motor vehicle. Then, the circuit arrangement in accordance with the invention is used for qualitative detection of the capacitance of the described sensor capacitor 1; when a given capacitance value of the sensor capacitor 1 is exceeded or not reached, the circuit arrangement can "respond", for example, initiate or enable opening or closing of the door of a motor vehicle.

The circuit arrangement in accordance with the invention includes a control unit 2, a monostable multivibrator 3 triggered by the control unit 2, and an evaluation unit 4. The monostable multivibrator 3 has a first input 5 connected to the control unit 2, a second input 6 connected to the sensor capacitor 1 and an output 7. When the monostable multivibrator 3 is triggered by the control unit 2, an output signal or output signals appear at the output 7 of the monostable multivibrator 3 with a time duration which is proportional to the capacitance of the sensor capacitor 1. The output signal or output signals of the multivibrator 3 are converted into a signal voltage proportional to its or their time duration. In the evaluation unit 4, a detection value which corresponds to the capacitance of the sensor capacitor 1 is obtained from the signal voltage.

In all the embodiments of the circuit arrangements in accordance with the invention shown in the figures, the output 7 of the monostable multivibrator 3 is connected upstream of a constant current generator 8 which can be controlled by its output signal or output signals. Also, an integrator 9, which converts the current delivered from the constant current generator 8 into the signal voltage, is connected to the constant current generator 8.

Regarding what form the trigger signal or trigger signals which have been generated by the control unit 2 have, how the trigger signal or signals are obtained and how the trigger signal or trigger signals trigger the monostable multivibrator 3, reference is made to the statements above.

Preferably, in the circuit arrangement in accordance with the invention, the integrator 9 is a capacitor as shown in FIGS. 2 to 5.

Figure 3:
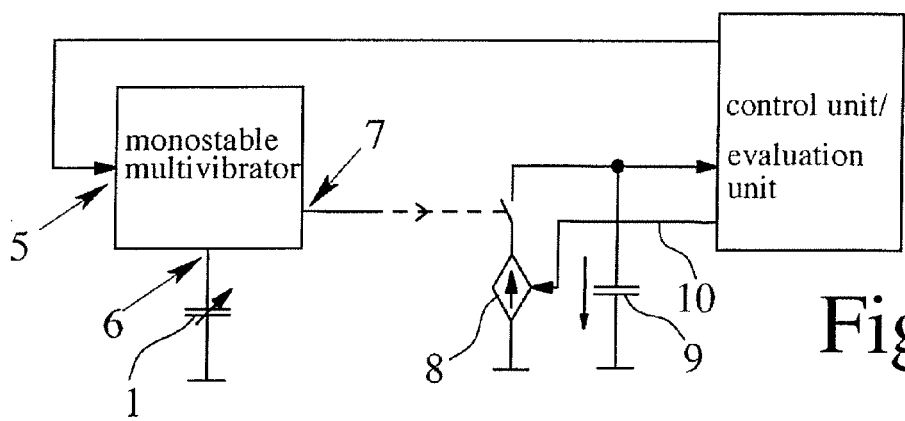

For the embodiment of the circuit arrangement in accordance with the invention shown in FIG. 3, it also applies that the control unit 2—in addition to the trigger signal or the trigger signals—provides a constant current generator influencing signal, with which the current intensity of the constant current generator can be influenced, especially controlled or adjusted. The constant current generator influencing signal travels from the control unit 2, via the illustrated connection 10, to the constant current generator 8.

Figure 4:
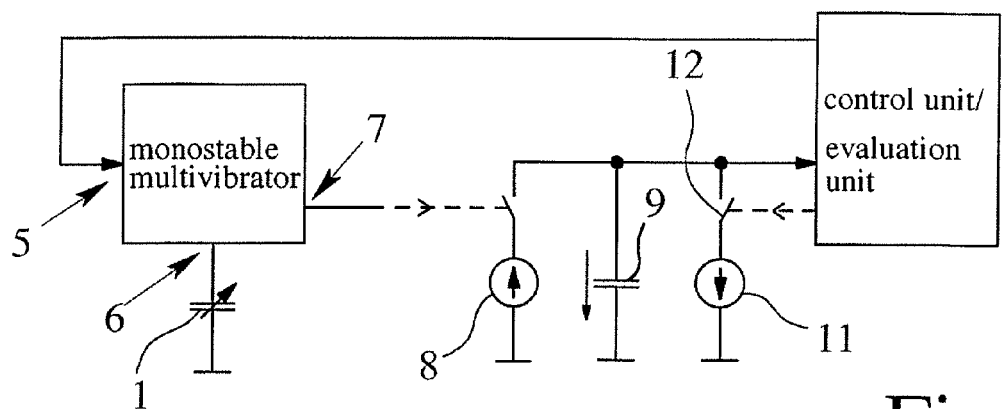

For the embodiment of the circuit arrangement in accordance with the invention shown in FIG. 4, it also applies that the control unit 2—in addition to the trigger signal or the trigger signals—provides a connection signal, and that a second constant current generator 11 can be connected with the connection signal and the second constant current generator 11 in the connected state which acts on the integrator 9 in the same direction or, as shown, in the opposite direction to the first constant current generator 8. This is shown in FIG. 4 by a switch 12 which can be actuated by the control unit 2 so that the second constant current generator 11 can be turned on and off.

Figure 5:
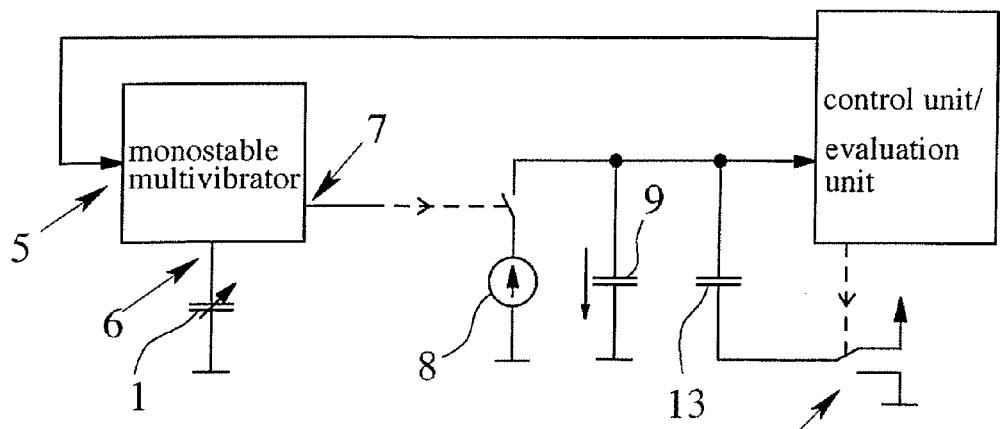

For the embodiment of the circuit arrangement in accordance with the invention shown in FIG. 5, it applies that the control unit 2—in addition to the trigger signal or the trigger signals, another connection signal is provided, there being a second integrator 13 made, as a capacitor like the first integrator 9. The second integrator 13 can be connected with the other connection signal and the second integrator 13, in the connected state, acts in the same direction or in the opposite direction to the first integrator 9. This is shown in FIG. 5 by a switch 14 which can be turned on and off by a second integrator 13 which can be actuated by the control unit 2.

What is claimed is:

1. Circuit arrangement for detecting the capacitance or change of capacitance of a capacitive circuit element or a component, comprising:
   a control unit,
   a monostable multivibrator triggered by the control unit,
   a constant current generator and
   an evaluation unit,
   wherein the monostable multivibrator has a first input which is connected to the control unit, a second input which is connected to the capacitive circuit element or component, and an output,
   wherein an output signal or output signals is produced at the output of the monostable multivibrator in response to the monostable multivibrator being triggered by the control unit,
   wherein said output signal or output signals have a time duration which is proportional to the capacitance of the capacitive circuit element or component,
   wherein an integrator means is connected to the constant current generator for converting the current delivered from the constant current generator into a signal voltage proportional to said time duration,
   wherein the output of the monostable multivibrator is connected upstream of the constant current generator and wherein the constant current generator is controllable by the output signal or output signals of the monostable multivibrator, and
   wherein the evaluation unit is adapted to produce a detection value corresponding to the capacitance or change of capacitance of the capacitive circuit element or component from the signal voltage.

2. Circuit arrangement as claimed in claim 1, wherein the control unit provides a rectangular trigger signal or signals to the monostable multivibrator.

3. Circuit arrangement as claimed in claim 2, wherein a flipping process in the monostable multivibrator is triggered only by a rising or falling edge of the rectangular trigger signal or signals of the control unit.

4. Circuit arrangement as claimed in claim 2, wherein a flipping process in the monostable multivibrator is triggered by both a rising and a falling edge of the rectangular trigger signal or signals of the control unit.

5. Circuit arrangement as claimed in claim 1, wherein the control unit has an oscillator and a trigger signal or signals are extracted from the oscillator voltage.

6. Circuit arrangement as claimed in claim 1, wherein only each n-th—n being uniform or variable number other than 1—trigger signal of the control unit triggers a flipping process in the monostable multivibrator.

7. Circuit arrangement as claimed in claim 1, wherein the control unit provides a binary random signal or a pseudorandom noise signal as the trigger signal.

8. Circuit arrangement as claimed in claim 1, wherein the control unit provides a constant current generator influencing signal in addition to the trigger signal or signals, the constant current generator influencing signal controlling or adjusting the current intensity of the constant current generator.

9. Circuit arrangement as claimed in claim 1, wherein the monostable multivibrator has a relatively low resistance on a second input which is connected to the capacitive circuit element or component.

10. Circuit arrangement as claimed in claim 1, wherein the integrator is a capacitor.

11. Circuit arrangement as claimed in claim 1, wherein the evaluation unit has a comparator which compares the signal voltage to a threshold value and triggers a detection signal when the signal voltage has reached the threshold value.

12. Circuit arrangement as claimed in claim 1, wherein an analog/digital converter is provided on the input side of the evaluation unit and is connected to the output of the integrator via the analog/digital converter.

13. Circuit arrangement as claimed in claim 1, wherein the capacitance or change of capacitance to be detected is determined from a detection time from the start of a detection time interval until triggering of the detection signal.

14. Circuit arrangement as claimed in claim 1, wherein the capacitance or change of capacitance to be detected is determined from the number of trigger signals from the start of a detection time interval to triggering of a detection signal.

15. Circuit arrangement as claimed in claim 1, wherein the control unit provides a connection signal in addition to the trigger signal or signals, wherein a second constant current generator is provided, wherein the second constant current generator is connected with the connection signal, and wherein, in a connected state, the second constant current generator acts on the integrator in a direction that is the same or opposite a direction in which the other constant current generator acts.

16. Circuit arrangement as claimed in claim 1, wherein the control unit provides a connection signal in addition to the trigger signal or signals, wherein a second constant current generator is provided, wherein the second constant current generator is connectable in a direction opposite a direction in which the other constant current generator acts, and wherein the capacitance or change of capacitance to be detected is determined from a time interval from the start of discharge by the second constant current generator until it drops below a threshold value.

17. Circuit arrangement as claimed in claim 1, wherein the control unit provides a connection signal in addition to the trigger signal or signals, wherein a second integrator is provided, wherein the second integrator is connectable with the connection signal, and wherein, in the connected state, the second integrator acts in the same direction or in an opposite direction to a direction in which the other integrator acts.

18. Circuit arrangement as claimed in claim 17, wherein the second integrator is a capacitor.

19. Circuit arrangement as claimed in claim 1, wherein a window function is implemented by which at least one of the trigger signals of the control unit and the output signals of the monostable multivibrator are active only during an adjustable time window.

20. Circuit arrangement as claimed in claim 1, wherein, for enabling detection of the capacitance or changes of capacitance of two capacitive components, a second monostable multivibrator has a first input which is connected to the control unit for enabling the second monostable multivibrator to be triggered by the control unit, wherein the second monostable multivibrator has a second input connected to a second capacitive circuit element or component, wherein upon triggering of the second monostable multivibrator by the control unit an output signal or signals at an output of the second monostable multivibrator, the output signal or signals having a time duration which is proportional to the capacitance of the second capacitive circuit element or component, wherein the output of the other monostable multivibrator and the output of the second monostable multivibrator are connected to a logic module and wherein the constant current generator is connected to the output of the logic module.

* * * * *